(12) United States Patent
Billoint et al.

(10) Patent No.: US 12,033,696 B2
(45) Date of Patent: Jul. 9, 2024

(54) MEMORY CIRCUIT COMPRISING A PLURALITY OF 1T1R MEMORY CELLS

(71) Applicant: COMMISSARIAT À L'ENERGIE ATOMIQUE ET AUX ENERGIES ALTERNATIVES, Paris (FR)

(72) Inventors: Olivier Billoint, Grenoble (FR); Carlo Cagli, Grenoble (FR); Laurent Grenouillet, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 172 days.

(21) Appl. No.: 17/860,607

(22) Filed: Jul. 8, 2022

(65) Prior Publication Data
US 2023/0012748 A1    Jan. 19, 2023

(30) Foreign Application Priority Data
Jul. 8, 2021 (FR) ...................................... 2107409

(51) Int. Cl.
*G11C 13/00* (2006.01)
*H10B 63/00* (2023.01)

(52) U.S. Cl.
CPC .......... *G11C 13/003* (2013.01); *G11C 13/004* (2013.01); *G11C 13/0069* (2013.01); *H10B 63/30* (2023.02); *G11C 2013/0083* (2013.01); *G11C 2213/79* (2013.01)

(58) Field of Classification Search
CPC . G11C 13/003; G11C 13/004; G11C 13/0069; G11C 2013/0083; G11C 2213/79; H10B 63/30; H10B 63/80; H10N 70/20; H10N 70/826; H10N 70/8833

USPC ....................................................... 365/255.7
See application file for complete search history.

(56) References Cited

U.S. PATENT DOCUMENTS

| | | | |
|---|---|---|---|
| 10,102,895 B1 * | 10/2018 | Li ...................... G11C 11/1655 |
| 10,374,039 B1 * | 8/2019 | Hashemi ................. H01L 21/84 |
| 11,145,382 B1 * | 10/2021 | Ramanan ......... G11C 29/12005 |
| 2017/0179196 A1 | 6/2017 | Grenouillet et al. |
| 2018/0204944 A1 * | 7/2018 | Schippel ............... H01L 29/408 |
| 2018/0269209 A1 | 9/2018 | Tan et al. |

(Continued)

OTHER PUBLICATIONS

Search Report as issued in French Patent Application No. 2107409, dated Apr. 4, 2022.

(Continued)

*Primary Examiner* — Huan Hoang
*Assistant Examiner* — Minh Dinh
(74) *Attorney, Agent, or Firm* — Pillsbury Winthrop Shaw Pittman LLP

(57) ABSTRACT

A memory circuit includes a plurality of memory cells, each memory cell including a resistive memory element and a selection transistor of the FDSOI type connected in series with the resistive memory element. The selection transistor includes a channel region, a buried insulating layer, a back gate separated from the channel region by the buried insulating layer. The memory circuit further includes a circuit for biasing the back gate of the selection transistors, the biasing circuit being configured to apply a forward back-bias to the selection transistor of at least one memory cell during a programming or initialisation operation of the at least one memory cell.

10 Claims, 5 Drawing Sheets

(56) References Cited

U.S. PATENT DOCUMENTS

2019/0252375 A1    8/2019  Delacruz et al.

OTHER PUBLICATIONS

Grenoullet, L., et al., "UTBB FDSOI transistors with dual STI for a multi-Vt strategy at 20nm node and below," IEEE, (Year: 2012), 4 pages.

Sandrini, J., et al., "OxRAM for embedded solutions on advanced node: scaling perspectives considering statistical reliability and design constraints," IEEE, (Year: 2019), 4 pages.

* cited by examiner

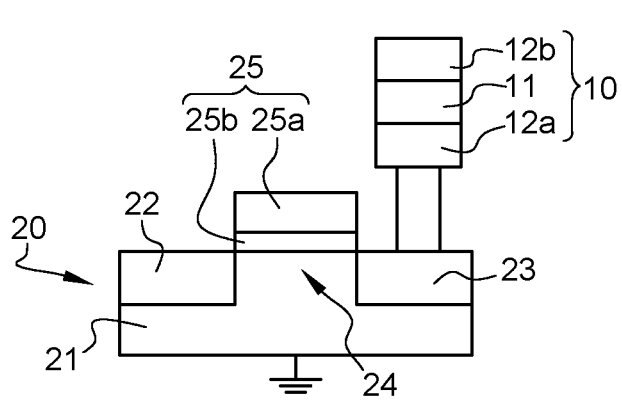
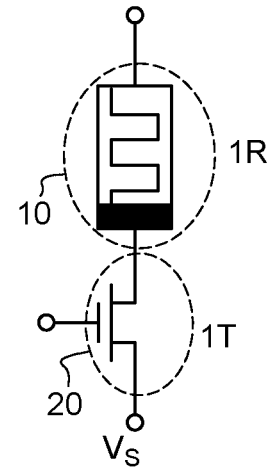
Fig. 1A  Fig. 1B
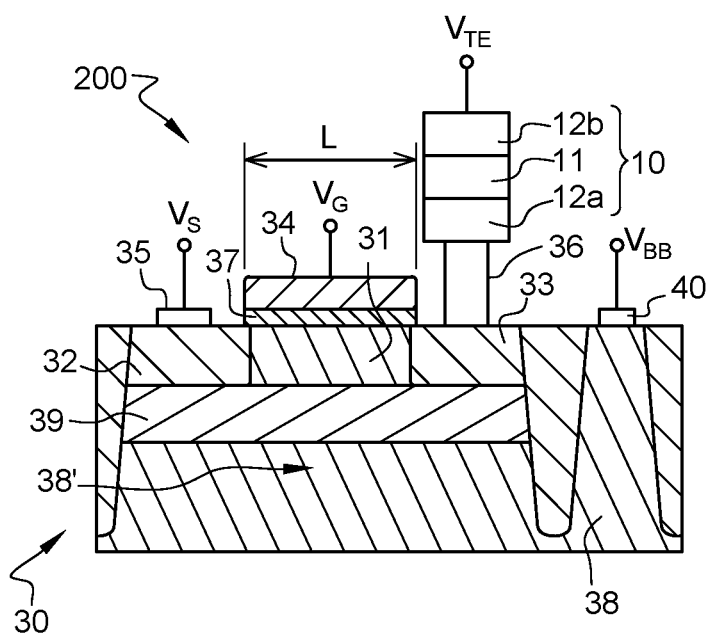
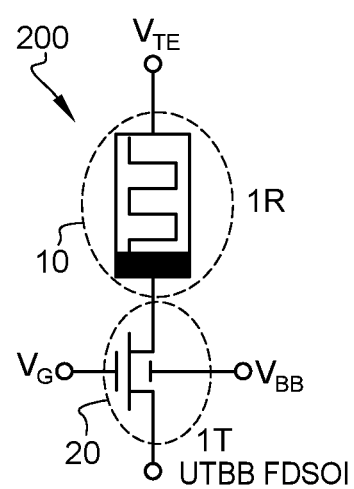
Fig. 2A  Fig. 2B

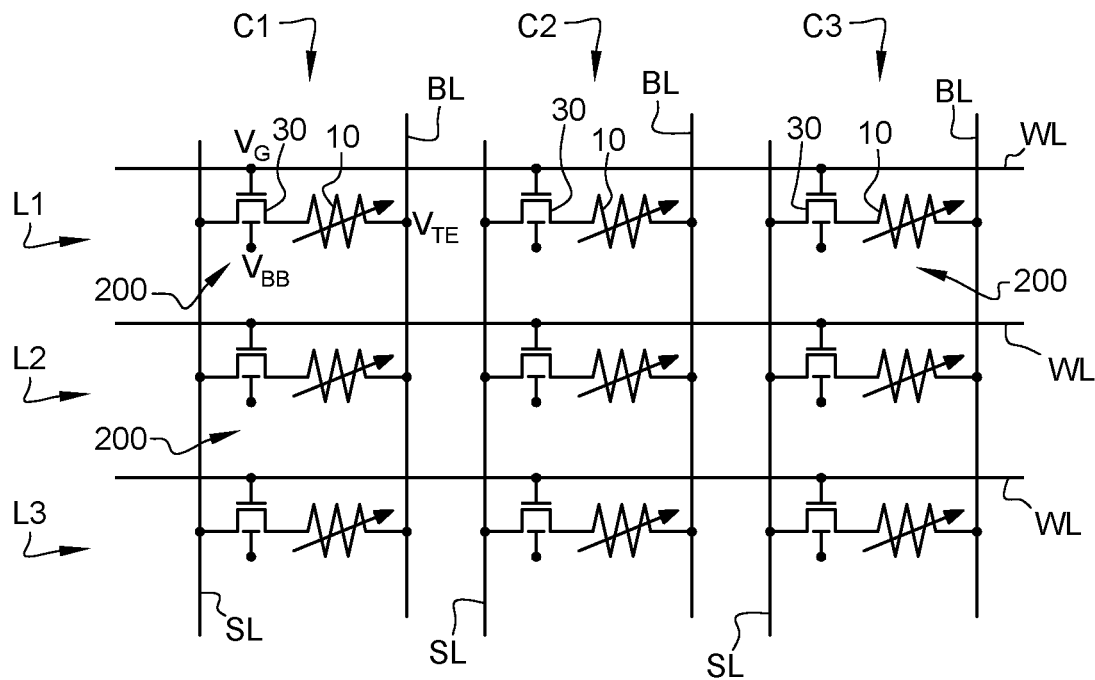
Fig. 3
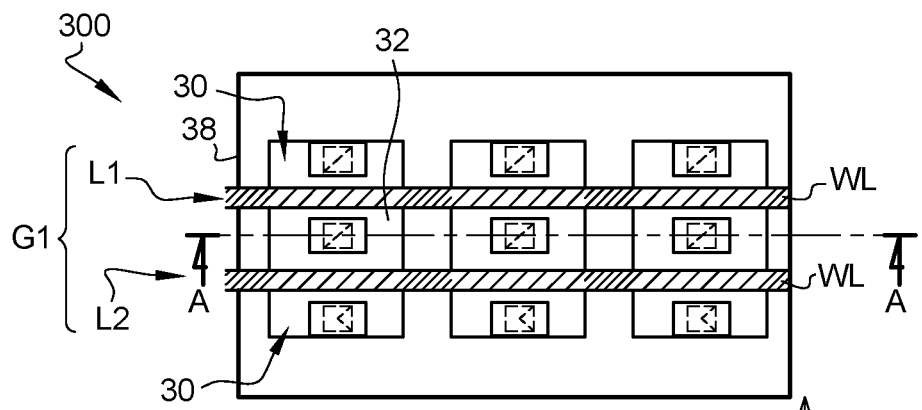
Fig. 4
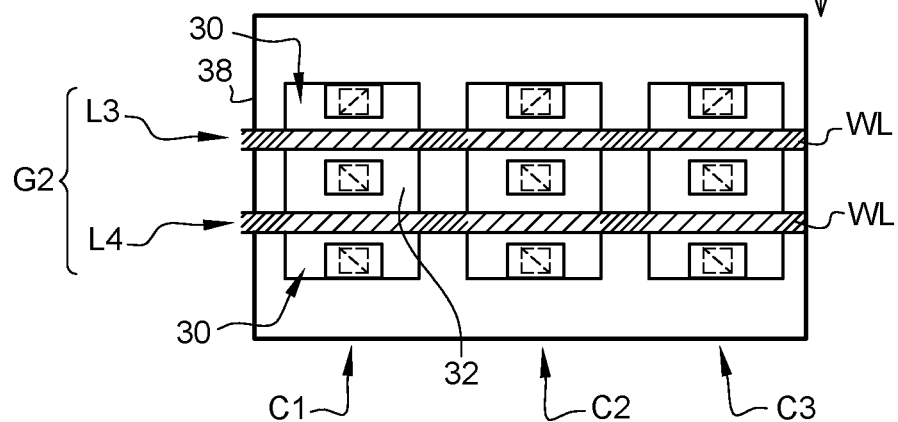

MEMORY CIRCUIT COMPRISING A PLURALITY OF 1T1R MEMORY CELLS

CROSS-REFERENCE TO RELATED APPLICATIONS

This application claims priority to French Patent Application No. 2107409, filed Jul. 8, 2021, the entire content of which is incorporated herein by reference in its entirety.

FIELD

The present invention relates to the field of resistive random access memories (RRAM). The invention more particularly relates to a memory device of the 1T1R type comprising a resistive memory element and a selection transistor connected in series with the resistive memory element. The invention also relates to a memory circuit comprising a plurality of 1T1R memory cells arranged in the form of a memory array.

BACKGROUND

Resistive memories, in particular oxide-based random access memories (OxRAM), are non-volatile memories that have for purpose to replace memories of the Flash type. In addition to a strong integration density, they have a high operating speed, high endurance and good compatibility with the methods of manufacturing currently used in the microelectronics industry, in particular with the back-end of line (BEOL) method of the CMOS technology.

Resistive memories comprise a multitude of memory cells arranged in the form of a memory array. In a so-called "1T1R" configuration shown in FIGS. 1A-1B, each memory cell (also called memory point) comprises a resistive memory element 10 («1R») and a selection transistor 20 («1T») connected in series with the resistive memory element 10. The resistive memory element 10 is constituted of a M-I-M (Metal-Insulator-Metal) stack comprising a layer of active material of variable electrical resistance 11 disposed between two metal electrodes 12a-12b. In an element of the OxRAM type, the active material is generally a transition metal oxide (ex. $HfO_2$, $Ta_2O_5$, $TiO_2$ ... ).

The resistive memory element 10 can reversibly switch between two resistance states, that correspond to logic values "0" and "1" used to encode an information bit. In certain cases, more than two resistance states can be generated, which makes it possible to store several information bits in the same memory cell.

The information is written in the memory cell by switching the resistive memory element 10 from a high resistance state (HRS) to a low resistance state (LRS). Inversely, to erase the information from the memory cell, the resistive memory element 10 is switched from the low resistance state to the high resistance state.

In resistive memories of the filamentary type such as OxRAM or conductive-bridge random-access memories (CBRAM), the change in resistance of the memory element is governed by the formation and the rupture of a conductive filament with a nanometric section between the two electrodes.

Immediately after the manufacture thereof, a memory element of the OxRAM type is in a virgin state characterised by a resistance (referred to as initial) that is very high, much higher than the resistance of the memory element when it is in the high resistance state. The oxide layer is indeed insulating in its initial state. In order for the memory element to be able to be used, it is necessary to accomplish a step of initialisation referred to as "forming". This step consists of a partially reversible breakdown of the oxide so as to generate for the first time the conductive filament (and therefore place the memory element in the low resistance state). After this breakdown, the initially insulating oxide layer becomes active and the memory element can switch between the low resistance state and the high resistance state by erase and write operations.

The step of forming is accomplished by applying between the two electrodes of the memory element a voltage (referred to as "forming") of a value that is much higher than the nominal operating voltage of the memory element (used during following write-erase cycles), for example a voltage of about 2.5 V for a nominal voltage of about 1.5 V.

The selection transistor 20 is used in particular to bias the resistive memory element 10 in such a way as to initialise, program or read the memory cell. It can also play the role of a current limiter. Indeed, it is necessary to limit the electric current that passes through the resistive memory element 10 in order to not degrade it during the step of initialisation and to control the size of the filament (obtained after a write operation), on which the properties of the memory element (dispersion of resistance states, memory window, endurance, temperature resistance . . . ) depend.

The selection transistor 20 can be a metal-oxide-semiconductor field effect transistor (MOSFET) formed in a bulk silicon substrate 21. The selection transistor 20 then comprises a source region 22, a drain region 23 and a channel region 24 disposed between the source region 22 and the drain region 23. The channel region 24 is overmounted by a gate structure 25 comprising a gate electrode 25a and a gate dielectric 25b.

The document ["OxRAM for embedded solutions on advanced node: scaling perspectives considering statistical reliability and design constraints", J. Sandrini et al., 2019 IEEE International Electron Devices Meeting (IEDM), p. 30.5.1-30.5.4, 2019] describes another 1T1R memory cell comprising a resistive memory element of the OxRAM type and a Fully Depleted Silicon On Insulator (FDSOI) selection transistor. In this document, it is shown that the needs of the OxRAM element in terms of programming current and forming voltage can be satisfied by an FDSOI transistor.

The size of a 1T1R memory cell is mainly dictated by the surface of the substrate (bulk silicon or SOI) occupied by the selection transistor, rather than by the dimensions of the memory element. This is due to the needs in current and in voltage of the memory element (which have to be satisfied by the selection transistor) and the fact that the memory element is formed in the so-called "back-end" portion of the circuit, in other words in the interconnect levels disposed on the substrate.

To increase the density of resistive memories, it is therefore necessary to reduce the surface occupied by the selection transistor of each memory cell. This reduction is carried out to the detriment of the current that the selection transistor is capable of delivering. However, the performance of the memory element such as the memory window become degraded for programming currents less than 100 µA.

SUMMARY

There is therefore a need to reduce the surface occupied by the selection transistor in a 1T1R memory cell without however decreasing the performance of the resistive memory element to which it is connected.

According to a first aspect of the invention, this need tends to be satisfied by providing a memory device comprising a resistive memory element and a selection transistor of the FDSOI type connected in series with the resistive memory element, the selection transistor comprising a channel region, a buried insulating layer and a back gate separated from the channel region by the buried insulating layer, the memory device further comprising a circuit for biasing the back gate of the selection transistor, the biasing circuit being configured to apply a forward back-bias (FBB) to the selection transistor during a programming or initialisation operation of the resistive memory element.

A back gate FDSOI transistor, also called —Ultra Thin Body and Buried oxide (UTBB) transistor, is capable of providing the same current as a MOS transistor on a bulk substrate (or as a FDSOI thick buried oxide transistor), while still occupying a smaller surface. Indeed, by applying a back-biasing to the transistor, it is possible to dynamically modulate the threshold voltage of the transistor and therefore its capacity to provide current. The current delivered by the UTBB FDSOI selection transistor can thus be increased punctually, typically during programming operations or during an initialisation operation (step referred to as "forming").

In an embodiment of the memory device, the biasing circuit is furthermore configured to apply a reverse back-bias (RBB) to the selection transistor during a read operation of the resistive memory element. The electrical consumption of the memory device is thus reduced.

Beneficially, the biasing circuit is furthermore configured to apply a reverse back-bias to the selection transistor outside the programming, initialisation and read operations of the resistive memory element.

In an embodiment, the resistive memory element is of the OxRAM, CBRAM or PCRAM type.

A second aspect of the invention relates to a memory circuit comprising a plurality of memory cells, each memory cell comprising a resistive memory element and a selection transistor of the FDSOI type connected in series with the resistive memory element, the selection transistor comprising a channel region, a buried insulating layer and a back gate separated from the channel region by the buried insulating layer. The memory circuit further comprises a circuit for biasing the back gate of the selection transistors, the biasing circuit being configured to apply a forward back-bias to the selection transistor of at least one memory cell during a programming or initialisation operation of said at least one memory cell.

Beneficially, the biasing circuit is furthermore configured to apply a reverse back-bias to the selection transistor of said at least one memory cell during a read operation of said at least one memory cell.

Beneficially, the biasing circuit is furthermore configured to, during a read operation of a memory cell, apply a reverse back-bias to the selection transistor of several memory cells adjacent to the read memory cell.

In an embodiment, the selection transistors of the memory cells are arranged in lines and in columns, the lines of transistors form several groups of transistors, each group of transistors comprising at least two lines of consecutive transistors, and the memory circuit comprises distinct regions of doped silicon called wells, each well comprising the back gates of the selection transistors belonging to a single and same group of transistors.

In a first embodiment of the memory circuit, the wells are doped with the same type of conductivity and spaced apart from one another. The selection transistors can all be of the NMOS type or all of the PMOS type.

In a second embodiment, the memory circuit comprises wells doped with a first type of conductivity and at least one well doped with a second opposite type of conductivity, the wells doped with the first type of conductivity and said at least one well doped with the second type of conductivity being disposed alternately. The wells doped with the first type of conductivity and said at least one well doped with the second type of conductivity can be adjacent or separated by electrical isolation trenches. In an embodiment, all the selection transistors of a group associated with an N-type doped well are of the NMOS type and all the selection transistors of a group associated with a P-type doped well are of the PMOS type.

Beneficially, each group of transistors comprises between 16 and 256 consecutive lines of transistors.

Each group of transistors can comprise one or more pairs of consecutive lines of transistors and, for each pair, the selection transistors that belong to the same column can share a same region chosen from the source region and the drain region.

In a particular embodiment, the biasing circuit is configured to apply a forward back-bias potential to a first well during a programming or initialisation operation of one or more memory cells belonging to the group associated with the first well.

According to a development of this embodiment, the biasing circuit is furthermore configured to apply a reverse back-bias potential to at least one second well distinct from the first well.

A third aspect of the invention relates to a method of operation of a memory circuit comprising a plurality of memory cells, each memory cell comprising a resistive memory element and a selection transistor of the FDSOI type connected in series with the resistive memory element, the selection transistor comprising a channel region, a buried insulating layer, a back gate separated from the channel region by the buried insulating layer. The method comprises a programming or initialisation operation of at least one memory cell, during which a forward back-bias is applied to the selection transistor of said at least one memory cell.

In an embodiment, the method further comprises a read operation of said at least one memory cell, during which a reverse back-bias is applied to the selection transistor of said at least one memory cell.

Beneficially, the method further comprises the application of a reverse back-bias to the selection transistors of the memory cells outside the programming, initialisation and read operations of the memory cells.

BRIEF DESCRIPTION OF THE FIGURES

Other characteristics and benefits of the invention shall appear clearly in the description given of it hereinbelow, for the purposes of information and in no way limiting, in reference to the following figures.

FIG. 1A is a schematical cross-section view of a 1T1R memory cell according to the prior art.

FIG. 1B is an equivalent electrical diagram of the 1T1R memory cell of FIG. 1A.

FIG. 2A is a schematical cross-section view of a 1T1R memory cell belonging to a memory device according to a first aspect of the invention.

FIG. 2B is an equivalent electrical diagram of the 1T1R memory cell of FIG. 2A.

FIG. 3 schematically shows a memory circuit comprising several memory cells 1T1R arranged in lines and in columns, according to a second aspect of the invention.

FIG. 4 shows the arrangement of the selection transistors in a first embodiment of the memory circuit.

For increased clarity, identical or similar elements are marked with identical reference signs on all the figures.

DETAILED DESCRIPTION

Figure 5:
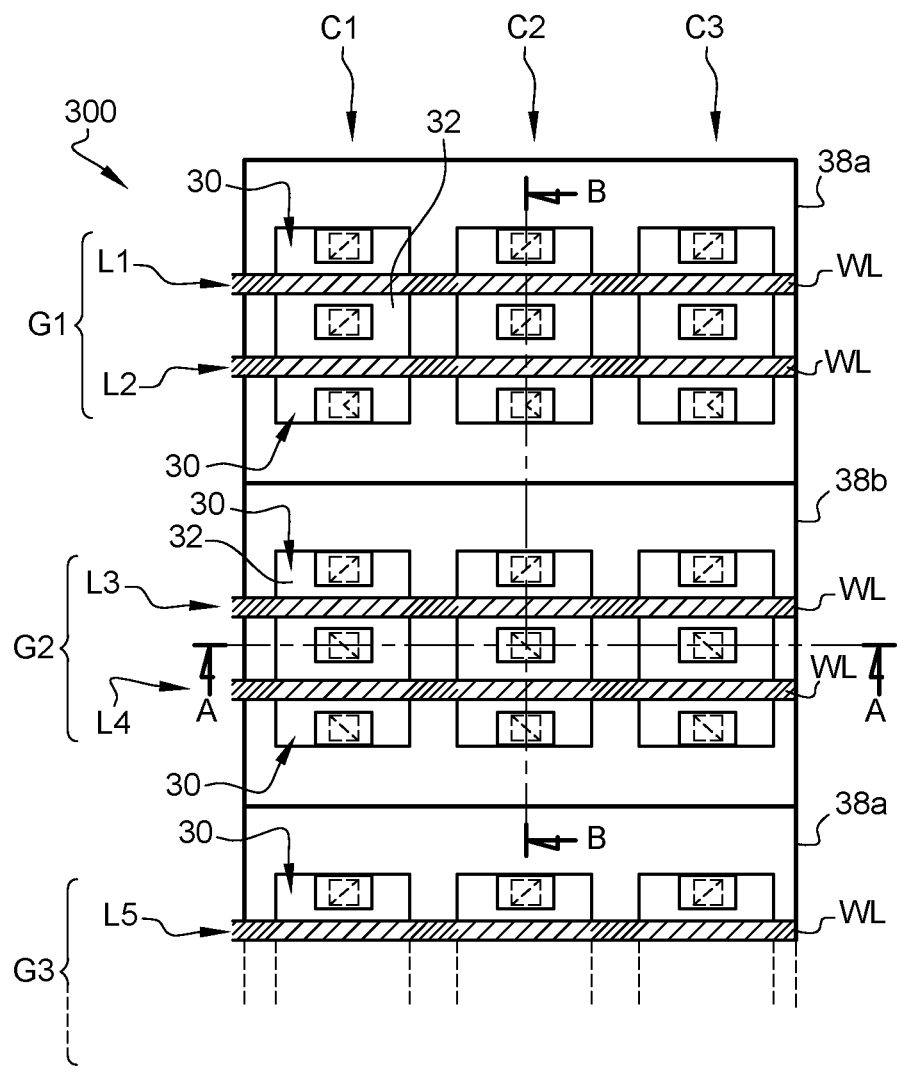
FIG. 5 shows the arrangement of the selection transistors in a second embodiment of the memory circuit.

FIGS. 2A-2B schematically show a memory cell 200 of the 1T1R type belonging to a memory device according to the invention.

The memory cell 200 comprises a resistive memory element 10 and a selection transistor 30 electrically connected in series with the resistive memory element 10.

The resistive memory element 10 is capable of reversibly switching between two resistive states: a high resistance state (HRS), also called "OFF" state, and a low resistance state (LRS) or "ON" state. It comprises a layer 11 of material of variable electrical resistance, also called resistive material, disposed between two electrodes:

a first electrode 12a called lower electrode, whereon the resistive material layer 11 is disposed; and a second electrode 12b called upper electrode and disposed on the resistive material layer 11.

The resistive memory element 10 is, in an embodiment, a memory element of the filamentary type, in other words a memory element of which the change in the resistance state is governed by the formation and the rupture of a conductive filament between the two electrodes 12a-12b.

The resistive memory element 10 is beneficially a memory element of the "OxRAM" type. The resistive material is then an oxide, for example a transition metal oxide (ex. $HfO_2$, $Ta_2O_5$, $TiO_2$ ... ) or a silicon oxide ($SiO_x$). The electrodes 12a-12b can be formed of doped silicon, of a silicide, of a metal (e.g. titanium, tantalum, tungsten ... ) or of a material with a metallic nature, such as titanium nitride (TiN) or tantalum nitride (TaN).

Alternatively, the resistive memory element 10 can be a memory element of the "CBRAM" type. The resistive material is then an ionic conductive and electrically insulating material. One of the electrodes (the cathode) is made from an inert material and the other electrode (the anode) is made from a soluble material.

The resistive memory element 10 can also be a memory element of the "PCRAM" type. In this case, the electrodes are constituted of inert materials and the resistive material is a phase-change material, typically a chalcogenide. The logic state of the memory element is then linked to the phase of the resistive material (typically "ON" state for a crystalline phase and "OFF" state for the amorphous phase).

The memory cell 200 can be subjected to programming operations, to read operations and to an initialisation operation commonly called "forming" (and of which the mechanism depends on the type of memory element). The programming operations consist of switching the resistive memory element 10 reversibly between the high resistance state (HRS) and the low resistance state (LRS). When the resistive memory element 10 passes from the high resistance state to the low resistance state, the corresponding programming operation is called a write or "set". Inversely, when the resistive memory element 10 passes from the low resistance state to the high resistance state, the corresponding programming operation is called erase or "reset". A programming operation can therefore be either a write operation, or an erase operation. The read operation makes it possible to determine in which resistance state the resistive memory element 10 is. Finally, the initialisation operation makes it possible, in the case of a CBRAM or of an OxRAM, to form for the first time the conductive filament.

The selection transistor 30 is used to bias the resistive memory element 10 in such a way as to initialise, program or read the memory cell 200. It can also play the role of a current limiter during the initialisation operation and the programming operations, so as to not degrade the resistive memory element 10. Thanks to the selection transistor 30, the electric current passing through the resistive memory element 10 cannot exceed a threshold value called compliance current. The compliance current of a resistive memory cell (RRAM) is typically comprised between 50 µA and 400 µA. It is defined according to the type, dimensions and performance criteria (such as the memory window, the endurance . . . ) of the resistive memory element 10.

The selection transistor 30 is a MOS transistor of the back gate FDSOI type, also called Ultra Thin Body and Buried oxide (UTBB) transistor. This type of MOS transistor is manufactured from a SOI substrate successively comprising a silicon support layer, an electrically insulating layer referred to as buried, generally a oxide layer (or BOX layer, for "buried oxide layer"), and a monocrystalline silicon thin film, also called active layer. The particularity of the UTBB FDSOI transistor is that the buried insulating layer is extremely thin, typically of a thickness less than 30 nm, which makes it possible to apply a back-biasing of the transistor. The thickness of the monocrystalline silicon thin film is typically less than 10 nm.

The selection transistor 30 thus comprises a channel region 31, a source region 32 and a drain region 33, all three formed in the silicon thin film of the SOI substrate. The channel region 31 is deposited between the source region 32 and the drain region 33. The silicon thin film is overmounted with a gate electrode 34, a source electrode 35 in contact with the source region 32 and with a contact stud 36 in contact with the drain region 33. The gate electrode 34 is separated from the channel region 31 by a gate dielectric 37. The contact stud 36 electrically connects the drain region 33 of the selection transistor 30 to the lower electrode 12 of the resistive memory element 10.

The selection transistor 30 can be a NMOS transistor (N-type doped source and drain regions 32-33) or PMOS (P-type doped source and drain regions 32-33). The channel region 31 is, in an embodiment, unintentionally doped.

The selection transistor 30 further comprises a doped silicon region 38 called well, of which a portion 38' called ground plane or back gate is located under the buried oxide layer 39 of the SOI substrate. The well 38 is formed by implanting doping impurities in the silicon support layer (not shown) of the SOI substrate. The back gate 38' can have a concentration in doping impurities that is higher than the remaining portion of the well 38.

The well 38 can be N-type or P-type doped. However, in an embodiment of the memory device, the well 38 of the selection transistor 30 is N-type doped in the case of a NMOS and of the P-type in the case of a PMOS, in order to obtain a low voltage threshold (LVT) transistor. A LVT transistor is here more beneficial than a high voltage threshold (HVT) transistor due to its capacity to provide more current in the ON state for an identical surface (or its smallest surface at a given current).

The back gate 38' acts as a second gate. By varying the electrical potential of the back gate 38', separated from the channel region 31 by the buried insulating layer 39, it is possible to modulate (dynamically) the threshold voltage of the UTBB FDSOI transistor and consequently its ON resistance state ($R_{ON}$).

During the operation of the memory cell 200, a first electrical potential $V_G$ (called gate potential) is applied on the gate electrode 34, a second electrical potential $V_S$ (source potential) is applied on the source electrode 35, a third potential $V_{TE}$ is applied on the upper electrode 12b of the resistive memory element 10 and a fourth electrical potential $V_{BB}$ called back-bias potential is applied on the back gate 38' by means of a back gate contact 40 in contact with the well 38. Each one of these electrical potentials can have different values according to the operating mode of the memory cell 200 (initialisation, write, erase and read). The back gate contact 40 is, in an embodiment, located at the same level (i.e. at the same height), as the source electrode 35 and the contact stud 36 (here on the silicon thin film). For the same well, several regularly spaced back gate contacts can be provided (for example every 30 μm) in order to provide a homogeneous bias.

In addition to the memory cell 200, the memory device comprises a circuit for biasing the back gate 38', connected to the back gate contact 40. This biasing circuit, not shown in the figures, is configured to select and apply the back-bias potential $V_{BB}$.

The initialisation operation and the programming (write, erase) operations of the memory cell 200 require a substantial current. The selection transistor 30 must therefore allow enough current to pass to allow for the change in the resistive state of the resistive memory element.

In the 1T1R memory cell of the prior art (cf. FIGS. 1A-1B), the selection transistor 20 is sized so as to be able to provide a current greater than or equal to the compliance current required to effectively program/initialise the memory cell.

In the memory device according to the invention, the selection transistor 30 of the memory cell 200 is on the contrary sized so that in the absence of back-bias, the maximum current delivered per transistor is less than the compliance current. A forward back-bias (FBB) is applied to the selection transistor 30 during programming operations and/or the initialisation operation of the memory cell 200, to temporarily increase the current delivered by the selection transistor 30.

Thus, the selection transistor 30 occupies a smaller surface (on the SOI substrate) than a conventional MOS transistor (on a bulk substrate) or than a FDSOI transistor devoid of a back gate (on SOI substrate), without however decreasing the performance of the resistive memory element 10. The size of the memory cell 200 is then reduced. Furthermore, as the dimensions of the selection transistor 30 are reduced, the leakage current of the selection transistor 30 in the OFF state are decreased. This results in a decrease in the static consumption of the memory cell 200.

The forward back-bias can be obtained by means of a positive back-bias potential ($V_{BB}>0$) in the case of a NMOS transistor and by means of a negative back-bias potential ($V_{BB}<0$) in the case of a PMOS transistor (whether the well 38 is N or P doped). In an embodiment, the back-bias potential $V_{BB}$ is such that the current delivered by the selection transistor 30 (under forward back-bias) is equal or substantially equal (±20%) to the predefined compliance current.

In an embodiment of the memory device, the biasing circuit is furthermore configured to apply to the selection transistor 30 a reverse back-bias (RBB) during a read operation of the memory cell 200. This has for effect to reduce the electrical consumption of the memory cell 200 without compromising the read (because the memory cell requires a lower current to be read).

Beneficially, the biasing circuit is furthermore configured to apply to the selection transistor 30 a reverse back-bias outside the programming, initialisation and read operations of the memory cell 200. Thus, the leakage currents of the selection transistor 30 in the OFF state and the static consumption of the memory cell 200 are further decreased.

The reverse back-bias can be obtained by means of a negative back-bias potential ($V_{BB}<0$) in the case of a NMOS transistor and by means of a positive back-bias potential ($V_{BB}>0$) in the case of a PMOS transistor (whether the well 38 is N or P doped).

Thus, the biasing circuit is capable of applying potential values $V_{BB}$ of opposite signs (at least one positive value and at least one negative value).

In order to select and apply the required value of the back-bias potential $V_{BB}$, the biasing circuit can comprise a multiplexer having several inputs subjected to different electrical potentials (for example, 0.9 V, −0.9 V and 0 V) and an output connected to the back gate contact 40.

The biasing circuit can furthermore be configured to select and apply the gate potential $V_G$, the source potential $V_S$ and the potential $V_{TE}$ of the upper electrode 12b of the resistive memory element 10.

By way of example, the selection transistor 30 is a NMOS transistor manufactured with UTBB FDSOI 28 nm technology. It comprises a gate electrode 34 of length L equal to 30 nm and an active zone of width W equal to 197 nm. The length L (referred to as gate length) is the dimension of the gate electrode 34 measured parallel to the SOI substrate in the cutting plane of FIG. 2A. The width W is the dimension of the active zone of the transistor (the active zone grouping together the channel region 31, the source region 32 and the drain region 33) measured parallel to the SOI substrate and perpendicularly to the cutting plane of FIG. 2A. A compliance current of 150 μA is reached under a forward back-bias of +0.9 V ($V_{BB}$=0.9 V). Under a reverse back-bias at −0.9 V ($V_{BB}$=−0.9 V), the current $1_{OFF}$ of the transistor in the OFF state is equal to 0.07 nA.

In comparison, to reach this same compliance current, a "bulk" technology NMOS transistor has to have a gate length L equal to 30 nm and an active zone width W equal to 226 nm, which represents an increase in surface of 13%. The current $1_{OFF}$ of the transistor NMOS bulk in the OFF state is measured at 0.83 nA.

FIG. 3 schematically shows a memory circuit 300 comprising a plurality of memory cells 200, such as described in relation with FIGS. 2A-2B. The selection transistors 30 of the memory cells 200 are arranged in lines Li and in columns Ci in the form of an array. In order to not needlessly complicate the figure, only three lines of transistors (L1, L2, L3) and three columns of transistors (C1, C2, C3) were represented. The resistive memory elements 10 can also be arranged in lines and in columns. In this case, it can be considered that the memory cells 200 are arranged in lines and in columns.

The memory circuit 300 further comprises a plurality of word lines WL, a plurality of source lines SL and a plurality of bit lines BL. Each word line WL electrically connects the gate electrodes of the selection transistors 30 belonging to the same line Li of memory cells 200. Each source line SL electrically connects the source electrodes of the selection transistors 30 that belong to the same column Ci of memory cells 200. Each bit line BL electrically connects the upper electrodes of the resistive memory elements 10 that belong to the same column Ci of memory cells 200. The word lines WL therefore convey the gate potential $V_G$, while the source lines SL convey the source potential $V_S$ and the bit lines BL convey the upper electrode potential $V_{TE}$.

The memory cells 200 can be addressed individually or collectively for the purposes of initialisation, programming or reading, by selecting one or more word lines WL, one or more source lines SL and one or more bit lines BL. The selected word, bit and source lines are brought to the suitable potentials to initialise, program or read the addressed memory cell or cells.

In addition to the array of memory cells 200, the memory circuit 300 comprises a biasing circuit (not shown in FIG. 3) electrically connected to the back gates of the selection transistors 30 of the array, in order to be able to select and apply a back-bias potential $V_{BB}$ to each back gate. This biasing circuit is configured to apply a forward back-bias (FBB) to the selection transistor 30 of one or more memory cells 200 of the array during a programming or initialisation operation of these memory cells 200.

The biasing circuit can further be configured to apply a reverse back-bias (RBB) to the selection transistor 30 of one or more memory cells 200 during a read operation of these memory cells 200.

Moreover, when a memory cell 200 of the array is addressed in such a way as to accomplish a programming, initialisation or read operation, a reverse back-bias (RBB) is beneficially applied to the selection transistors 30 of several memory cells adjacent to the addressed memory cell, in order to decrease the leakage currents (currents in the OFF state) of these transistors. The electrical consumption of the array is thus decreased. A read error can also be avoided. Indeed, the leakage currents of the adjacent memory cells can be added to the current passing through the addressed memory cell and thus skew the determination of the resistance state of the addressed memory cell. The adjacent memory cells are cells connected to the same source line SL and to the same bit line BL as the addressed memory cell (but to different word lines WL).

Even more beneficial, during the read of a memory cell, a reverse back-bias (RBB) is beneficially applied to the selection transistors 30 belonging to all the lines Li other than the one to which the read memory cell belongs. The power consumption of the memory array is then very greatly reduced.

The selection transistors 30 that belong to the same line Li can share the same well. The memory circuit 300 then comprises as many wells as lines Li. Such a configuration however complicates the biasing circuit, multiplies the connection lines of the wells and drastically reduces the integration density of the memory circuit (in other words the density of the memory cells). Indeed, in order to be independent electrically, the wells have to be spaced apart by a minimum distance in the support layer of the SOI substrate or insulated from one another by first electrical isolation trenches called deep isolation trenches (DTI technique, for "Deep Trench Isolation").

FIGS. 4 and 5 show two embodiments of the memory circuit 300 wherein the selection transistors 30 are arranged in such a way as to be able to easily apply a back-bias to them while still increasing the integration density of the memory circuit 300. The resistive memory elements of the memory cells are not shown in these FIGS. 4-5 (given that they do not limit the surface of the substrate occupied by the memory cells). The bit lines and the source lines are also not shown.

In these embodiments of the memory circuit 300, the lines Li of transistors are distributed into several groups Gi of transistors, each group Gi comprising at least two consecutive lines Li. Furthermore, each group Gi is associated with a well 38 comprising the back gates of the selection transistors 30 belonging to this group Gi. In other terms, the memory circuit 300 comprises a number of wells 38 that is identical to the number of groups Gi. The transistors belonging to the same group Gi are produced on the same well.

Thus, all the back gates of the selection transistors 30 belonging to a group Gi are subjected to the same back-bias potential $V_{BB}$, which greatly simplifies the design and the manufacture of the memory circuit, in particular of the biasing circuit.

When one or more memory cells are programmed or initialised, their selection transistors belong to a same first group Gi, a forward back-bias potential (FBB) is applied (by the biasing circuit) to the well 38 associated with this first group Gi.

In order to reduce the power consumption of the memory circuit, a reverse back-bias potential (RBB) is beneficially applied to the well of one or more other groups Gi of transistors (of which the memory cells are not addressed). In an embodiment, the reverse back-bias potential is applied to all the wells 38 other than the one associated with the addressed memory cells.

In the embodiment of FIG. 4, the wells 38 associated with the different groups Gi are doped with the same type of conductivity (type N or type P) and spaced apart from one another. The distance d (measured in the direction of columns Ci) that separates two consecutive wells 38 is, in an embodiment, comprised between 100 nm and 600 nm, and in an embodiment greater than or equal to 400 nm.

The selection transistors 30 of the memory array are, in an embodiment, all of the NMOS type or all of the PMOS type. Good homogeneity of the performance of the memory cells can thus be obtained.

In order to obtain low voltage threshold (LVT) selection transistors 30, the wells 38 are beneficially N-type doped in the case of NMOS transistors and P-type doped in the case of PMOS transistors.

In the embodiment of FIG. 5, the memory circuit 300 comprises wells 38a doped with a first type of conductivity, for example of the N-type, and at least one well 38b doped with a second opposite type of conductivity, for example of the P-type. The wells 38a doped with the first type of conductivity and the well or wells doped with the second type of conductivity are disposed alternately.

The groups Gi of transistors are thus distributed into first groups and second groups alternately, the first groups being associated with wells 38a doped with the first type of conductivity and the second groups being associated with wells 38b doped with the second type of conductivity. In other words, two wells 38a doped with the first type of conductivity are separated by a well 38b doped with the second type of conductivity (and inversely from two wells 38b).

Comparatively to the embodiment of FIG. 4, the space between two wells of the same type of conductivity is used to dispose a well of the opposite type of conductivity. This arrangement makes it possible to increase the integration density of the memory circuit 300, because the N-type and P-type wells are then adjacent or separated by first isolation trenches (deep isolation trenches). Thanks to these isolation trenches, it is possible to simultaneously bias a well as forward (FBB) and an adjacent well (therefore of the opposite type) as reverse (RBB). In the absence of isolation trenches between the wells, a single type of biasing (FBB or RBB) is possible and the PN diodes formed by the adjacent wells are reversed biased. The first isolation trenches have a width less than the distanced of FIG. 4, and, in an embodiment, less than 200 nm.

In an embodiment, the selection transistors 30 that share an N-type doped well are NMOS transistors and the selection transistors 30 that share a P-type doped well are PMOS transistors.

The following table indicates the back-bias modes (FBB or RRB) of the selection transistors 30 of the memory circuit, according to an embodiment of a method of operation of the memory circuit. The back-bias mode is given for each type of operation (read, initialisation, write and erase) that the method of operation is likely to comprise.

TABLE 1

|  | Initialisation | Write (SET) | Erase (RST) | Read |
| --- | --- | --- | --- | --- |
| selected well | FBB | FBB | FBB | RBB |
| non-selected well | RBB | RBB | RBB | RBB |

During an initialisation or a programming (write or erase) of one or more memory cells, the well 38, 38a, 38b associated with these memory cells (so-called "selected" well) is forward biased (FBB) and, in an embodiment, at least one other well (referred to as "non-selected") is reverse biased (RBB). Beneficially, all the non-selected wells are reverse biased (RBB).

During a read of one or more memory cells, the selected well is reverse biased (RBB) and, in an embodiment, at least one non-selected well is also reverse biased (RBB). Beneficially, all the wells are reverse biased (RBB).

In an embodiment, the groups Gi each comprise an even number of lines Li. In each group Gi, the lines Li are beneficially connected two-by-two to form one or more pairs of consecutive lines Li. For each pair of lines Li, the two selection transistors 30 that belong to the same column Ci share the same source region 32. This particular arrangement of the selection transistors 30 further increases the integration density of the memory circuit 300.

In an alternative embodiment not shown in the figures, the two selection transistors 30 belonging to the same pair of lines Li and to the same column Ci share the same drain region 33.

Figure 6A:
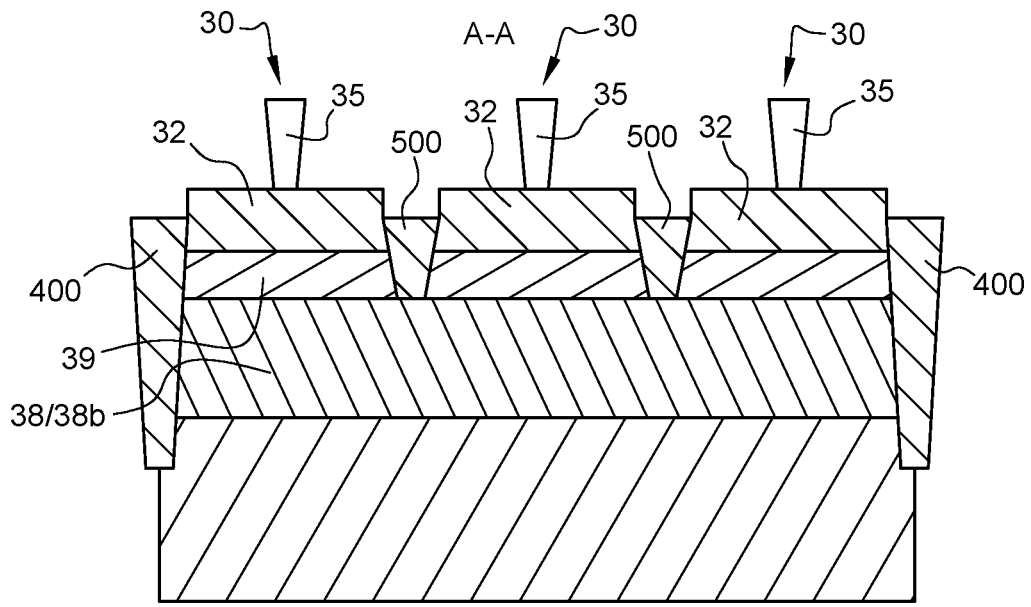
FIG. 6A is a partial cross-section view of the memory circuit along the cutting plane A-A of FIGS. 4 and 5.

FIG. 6A shows a portion of the memory circuit along the cutting plane A-A of FIGS. 4 and 5. The cutting plane A-A passes through the source electrodes 35 of the selection transistors 30 that belong to the same line Li. In each group Gi, the selection transistors 30 that belong to the same line Li and to distinct columns Ci are separated by second isolation trenches 500 called shallow trench isolation (STI technique). The well 38 (or 38a, 38b according to the case) associated with the group Gi is beneficially surrounded by first isolation trenches 400 (deep isolation trenches). The second isolation trenches 500 are not as deep as the first isolation trenches 400. They extend through the buried oxide layer 39 to the well 38, while the first isolation trenches 400 extend at least over the entire height of the well 38.

Figure 6B:
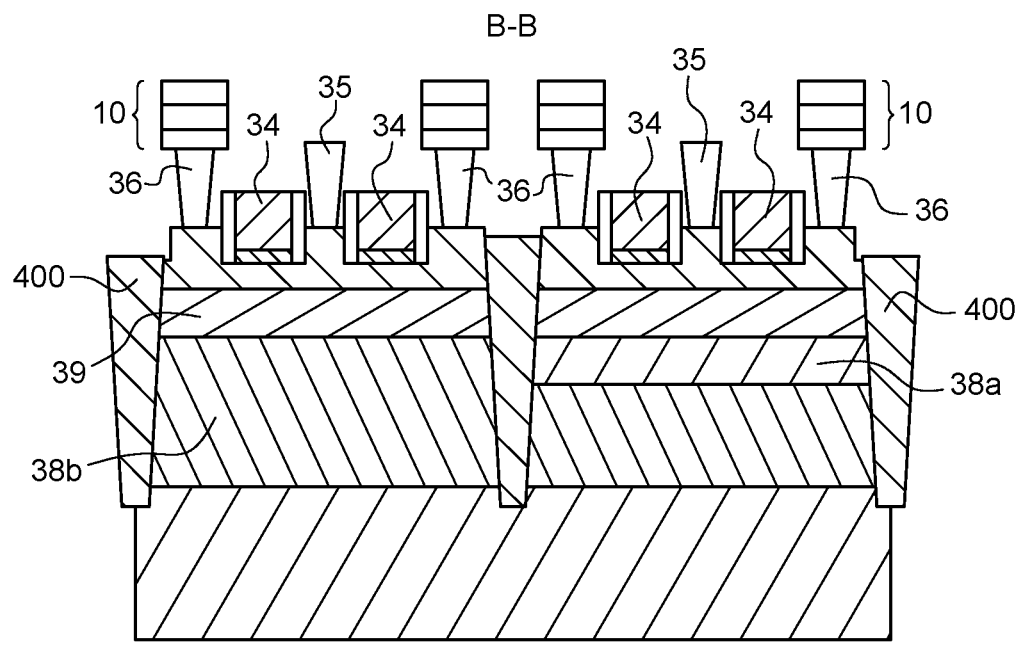
FIG. 6B is a partial cross-section view of the memory circuit along the cutting plane B-B of FIG. 5.

FIG. 6B shows another portion of the memory circuit along the cutting plane B-B of FIG. 5. Contrary to the cutting plane A-A, the cutting plane B-B is oriented in the direction of the columns Ci. It passes through the source electrodes 35 of the selection transistors 30 that belong to the same column Ci and by the contact studs 36 of the resistive memory elements 10 that belong to this same column Ci (these resistive memory elements 10 being visible in the figure).

FIG. 6B shows in particular that two consecutive wells 38a-38b, one N-type doped and the other P-type doped, can be separated by first isolation trenches 400 (deep isolation trenches).

Figure 7:
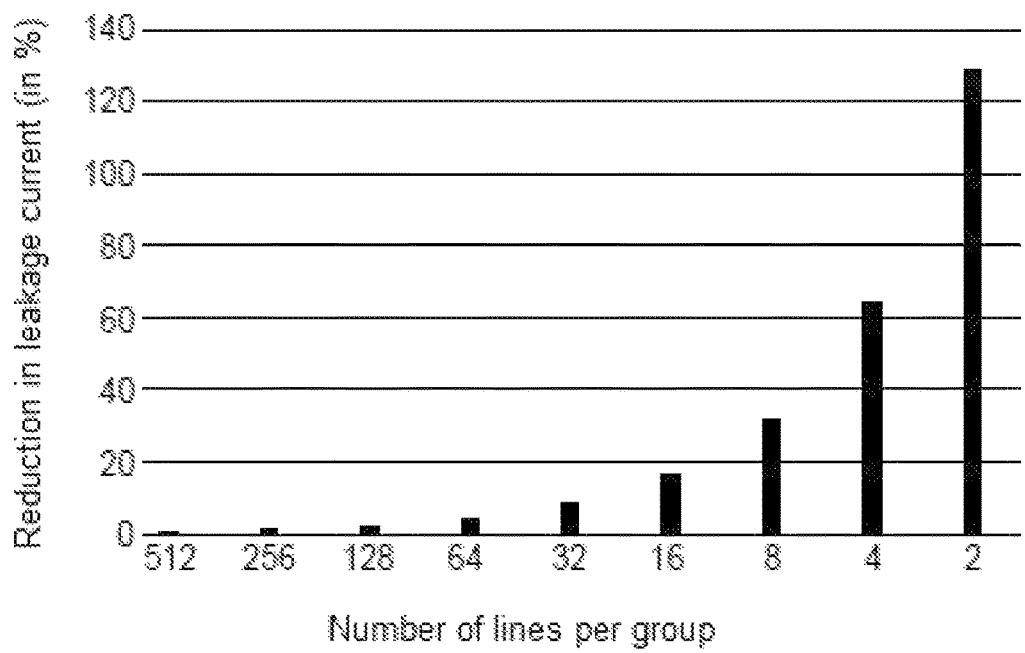
FIG. 7 is a graph showing the increase in surface caused by the distribution of the lines of transistors into groups, according to the number of lines of transistors per group.

FIG. 7 shows the increase in the surface of the memory array caused by the grouping of lines Li of memory cells and the multiplication of the wells, comparatively to the case of a memory circuit devoid of a well or that comprises only one well for the entire array (NMOS or PMOS as bulk selection transistor technology). The increase in the surface is expressed as a percentage and represented according to the number of lines per group/well (one well per group of lines).

The lower the number of lines Li per group Gi is, the higher the number of wells is (for the same number of lines, for example 1024 lines) and the more substantial the increase in surface is.

Figure 8:
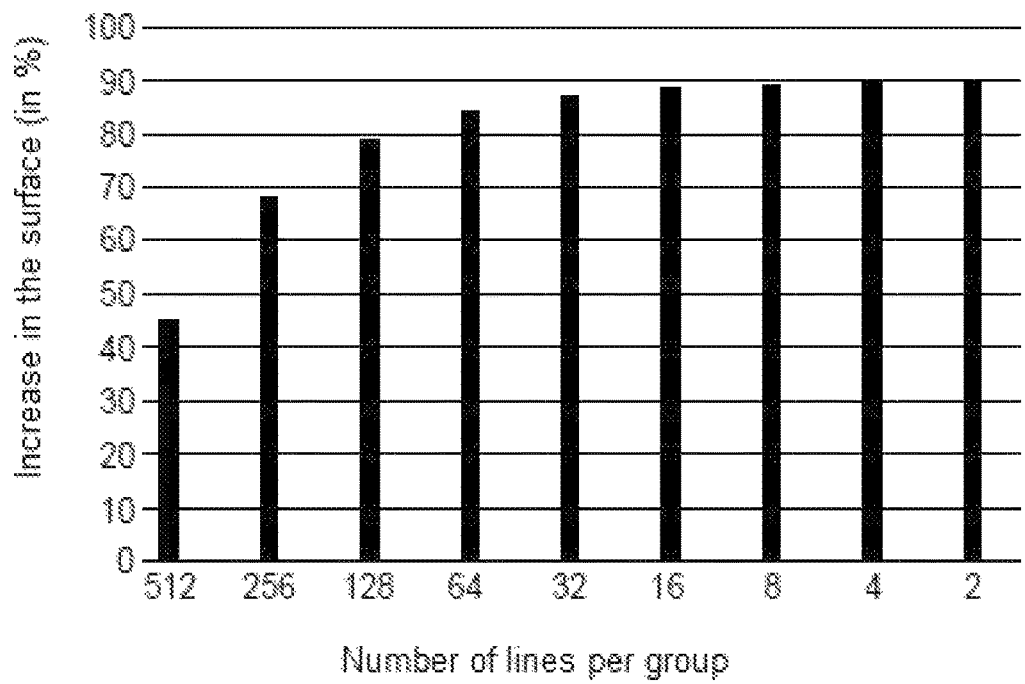
FIG. 8 is a graph showing the decrease in leakage currents of memory circuit during the read of a memory cell, according to the number of lines of transistors per group.

FIG. 8 shows, as an offset to this extra cost in surface, the reduction in the leakage currents during the read of a memory cell, this reduction being obtained thanks to the reverse back-bias of the other wells. Again, the reduction in leakage current is expressed as a percentage and represented according to the number of lines per group/well.

The lower the number of lines Li per group Gi is, the higher the number of lines Li under reverse back-bias is and the more substantial the reduction in leakage currents is.

According to FIGS. 7 and 8, a good compromise between the reduction in leakage currents (and therefore a drop in consumption) and the increase in the surface of the array (loss of integration density) can be achieved for a number of lines Li per group Gi comprised between 16 and 256. For example, when the groups Gi comprise 64 lines Li, the leakage currents are reduced 84.38% for an increase in surface of only 3.81%.

It will be appreciated that the various embodiments described previously are combinable according to any technically permissible combinations.

The invention claimed is:

1. A memory circuit comprising a plurality of memory cells, each memory cell comprising a resistive memory element and a selection transistor of the FDSOI (Fully Depleted Silicon On Insulator) type connected in series with the resistive memory element, the selection transistor comprising a channel region and a buried insulating layer, the selection transistor further comprising a back gate separated from the channel region by the buried insulating layer, the memory circuit further comprising a circuit for biasing the back gate of the selection transistors, the biasing circuit being configured to apply a forward back-bias to the selection transistor of at least one memory cell during a programming or initialisation operation of said at least one memory cell, wherein:

the selection transistors of the memory cells are arranged in lines and in columns;

the lines of transistors form several groups of transistors, each group of transistors comprising at least two lines of consecutive transistors, and the memory circuit comprises distinct regions of doped silicon forming wells, each well comprising the back gates of the selection transistors belonging to a single and same group of transistors.

2. The memory circuit according to claim 1, wherein the wells are doped with the same type of conductivity and spaced apart from one another.

3. The memory circuit according to claim 1, comprising wells doped with a first type of conductivity and at least one well doped with a second opposite type of conductivity, the wells doped with the first type of conductivity and said at least one well doped with the second type of conductivity being disposed alternately.

4. The memory circuit according to claim 3, wherein the wells doped with the first type of conductivity and said at least one well doped with the second type of conductivity are adjacent or separated by electrical isolation trenches.

5. The memory circuit according to claim 1, wherein each group of transistors comprises one or more pairs of consecutive lines of transistors and wherein, for each pair, the selection transistors that belong to the same column share a same region chosen from the source region and the drain region.

6. The memory circuit according to claim 1, wherein the biasing circuit is configured to apply a forward back-bias potential to a first well during a programming or initialisation operation of one or more memory cells the selection transistor of which belongs to the group associated with the first well.

7. The memory circuit according to claim 6, wherein the biasing circuit is furthermore configured to apply a reverse back-bias potential to at least one second well distinct from the first well.

8. A method of operation of a memory circuit according to claim 1, the method comprising a programming or initialisation operation of at least one memory cell, during which a forward back-bias is applied to the selection transistor of said at least one memory cell.

9. The method according to claim 8, further comprising a read operation of said at least one memory cell, during which a reverse back-bias is applied to the selection transistor of said at least one memory cell.

10. The method according to claim 8, further comprising application of a reverse back-bias to the selection transistors of the memory cells outside the programming, initialisation and read operations of the memory cells.

* * * * *